United States Patent [19]
Taranko et al.

[11] Patent Number: 4,981,568
[45] Date of Patent: Jan. 1, 1991

[54] APPARATUS AND METHOD FOR PRODUCING HIGH PURITY DIAMOND FILMS AT LOW TEMPERATURES

[75] Inventors: Alexander R. Taranko, Jefferson Valley; David A. Smith, Katonah, both of N.Y.

[73] Assignee: International Business Machines Corp., Armonk, N.Y.

[21] Appl. No.: 503,107

[22] Filed: Apr. 2, 1990

Related U.S. Application Data

[63] Continuation of Ser. No. 247,051, Sep. 20, 1988, abandoned.

[51] Int. Cl.$^5$ .............................................. C23C 14/00
[52] U.S. Cl. .......................... 204/192.31; 204/298.05; 427/38; 427/47; 118/723
[58] Field of Search ....................... 204/192.11, 192.15, 204/192.16, 192.26, 192.31, 298.04, 298.05, 298.16; 118/50.1, 719, 723, 724, 725, 726; 427/35, 38, 47, 49; 250/423 R, 425, 492.3

[56] References Cited

U.S. PATENT DOCUMENTS

| | | | |
|---|---|---|---|
| 3,117,022 | 1/1964 | Bronson et al. | 427/38 |
| 3,961,103 | 1/1976 | Aisenberg | 427/39 |
| 4,191,735 | 3/1980 | Nelson et al. | 423/446 |
| 4,486,286 | 12/1984 | Lewin et al. | 204/192 C |
| 4,490,229 | 12/1984 | Mirtich et al. | 204/192 C |
| 4,504,519 | 3/1985 | Zelez | 427/39 |
| 4,725,345 | 2/1988 | Sakamoto et al. | 204/192.31 |

FOREIGN PATENT DOCUMENTS

| | | |
|---|---|---|
| 138678 | 8/1978 | Fed. Rep. of Germany . |
| 146626 | 2/1981 | Fed. Rep. of Germany . |
| 58-55319 | 9/1981 | Japan . |
| 57-63675 | 4/1982 | Japan . |
| 57-106513 | 7/1982 | Japan . |
| 60-127299 | 7/1985 | Japan . |
| 60-131896 | 7/1985 | Japan . |
| 61-164701 | 7/1986 | Japan . |
| 61-215294 | 9/1986 | Japan . |

OTHER PUBLICATIONS

"New Era of Technology . . . Process", New York Times, Sep. 14, 1986.

*Primary Examiner*—Nam X. Nguyen
*Attorney, Agent, or Firm*—Pollock, Vande Sande & Priddy

[57] ABSTRACT

Apparatus and method for producing diamond films. A source of free electrons is used to bombard a carbon block. Incident electrons vaporize the carbon surface, and free carbon atoms are ionized from collisions of the electrons with the carbon atoms. A collimating plate located above the carbon block includes an aperture for permitting the vaporized carbon ions to be collimated. On the other side of the collimating plate are first and second deflector plates, symmetrical with respect to the axis of the collimating plate aperture. A voltage potential therebetween produces an electrostatic field perpendicular to the axis of the aperture. Substrates located in the electrostatic field receive a carbon ion film which is essentially a diamond film structure.

18 Claims, 1 Drawing Sheet

4,981,568 ptinstant
APPARATUS AND METHOD FOR PRODUCING HIGH PURITY DIAMOND FILMS AT LOW TEMPERATURES This application is a continuation of application Ser. No. 247,051, filed Sept. 20, 1988.

BACKGROUND OF THE INVENTION

The present invention relates to the diamond film deposition art. Specifically, a technique for producing diamond film deposition at low temperatures is described.

Manufacture of electronics components in many instances requires hard surface coatings to protect underlying materials. In the microelectronic art, a substrate including a microelectronic circuit is coated with a vinyl protective packaging layer which keeps the surface of the substrate bearing the electronics components free from contamination. Similarly, magnetic disk media used as a memory medium in computer disk drives also require on the surface thereof a protective film which is both hard and insulating and which does not interfere with the reading and writing of data to the disk. Additionally, future uses of diamond surfaces in the manufacture of computer chip substrates will offer a durability and heat transfer capability which exceeds current substrate design. These materials, because of their ability to shed heat, will permit higher density circuits to be fabricated.

The present techniques for forming diamond films often require the use of high temperatures and/or the presence of numerous contaminants. In order to produce a diamond film of sufficient purity, a tedious measurement and system monitoring are inefficient for high volume, low cost applications.

References in the prior art which describe these various techniques for growing synthetic diamond films include U.S. Pat. Nos. 4,191,735, 3,961,103 and 4,486,286. These techniques employ the use of a plasma for generating ion particles. In U.S. Pat. No. 3,961,103, the extracted ions are used to bombard a cathode to sputter or vaporize atoms of a desired material into a discharge space where they are ionized. The plasma therefore contains large concentrations of ions of a desired species, as well as a concentration of contaminants of an undesired species. The substrate upon which the diamond film is grown is directly exposed to excessive heat and contaminants.

The present invention provides a technique which will yield a relatively pure diamond film at moderate temperatures, which do not adversely effect typical electronic circuit substrates.

SUMMARY OF THE INVENTION

It is an object of this invention to grow diamond films on substrates which are relatively contaminant free.

It is another object of this invention to grow diamond films on a substrate at moderate temperatures which will not adversely effect a substrate.

These and other objects are accomplished in accordance with the invention. A source of carbon ions is generated through the use of an E-gun and carbon block. A standard tungsten filament electron source of an E-gun is used to vaporize the surface of a carbon block. Vaporized carbon atoms collide with the incident electrons, forming a source of carbon ions.

The source of carbon ions is advantageously disposed underneath an apertured plate which serves as a collimator. The apertured plate passes the vaporized carbon ions into a collimated beam. On the opposite side of the collimator plate, two electrostatic field plates are disposed. The electrostatic field plates are advantageously symmetrical with respect to the axis of the aperture in the collimator plate. An electric field is established between the electrostatic field plates. The carbon ions which exit the collimator plate aperture are swept in a direction perpendicular to the collimated beam. A substrate is located in the path of the accelerated carbon ions. A film of the carbon ions, which is substantially diamond, is deposited on the substrates.

The carbon ion beam rises due to the heat of vaporizing the beam. A few charged contaminants are produced from the E-gun and carbon atom collisions. Carbon ions and atoms pass through the shield plate collimator wherein the ions are separated and essentially purified with an electrostatic field and directed toward the substrate. The uncharged particles continue travelling in a vertical direction above the substrate and are not directed towards the substrate.

DESCRIPTION OF THE PREFERRED EMBODIMENT

Figure 2:
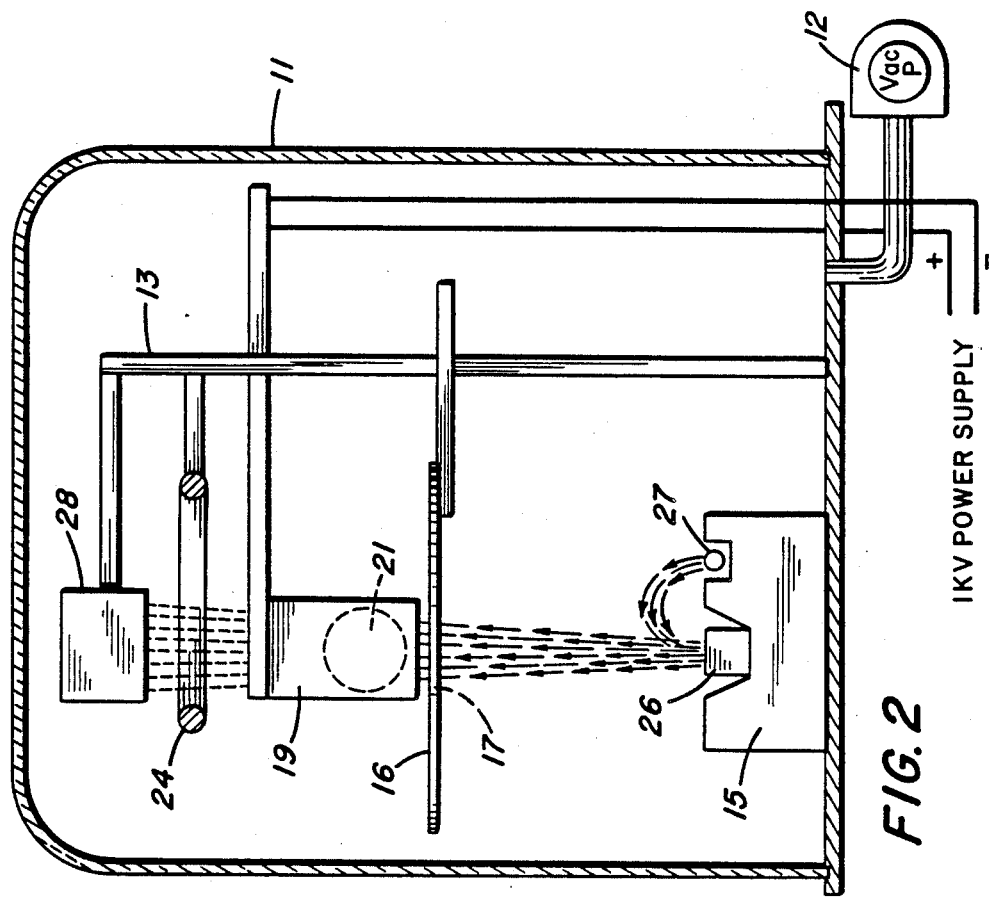
FIG. 2 is a side view of the diamond film producing apparatus.
Figure 1:
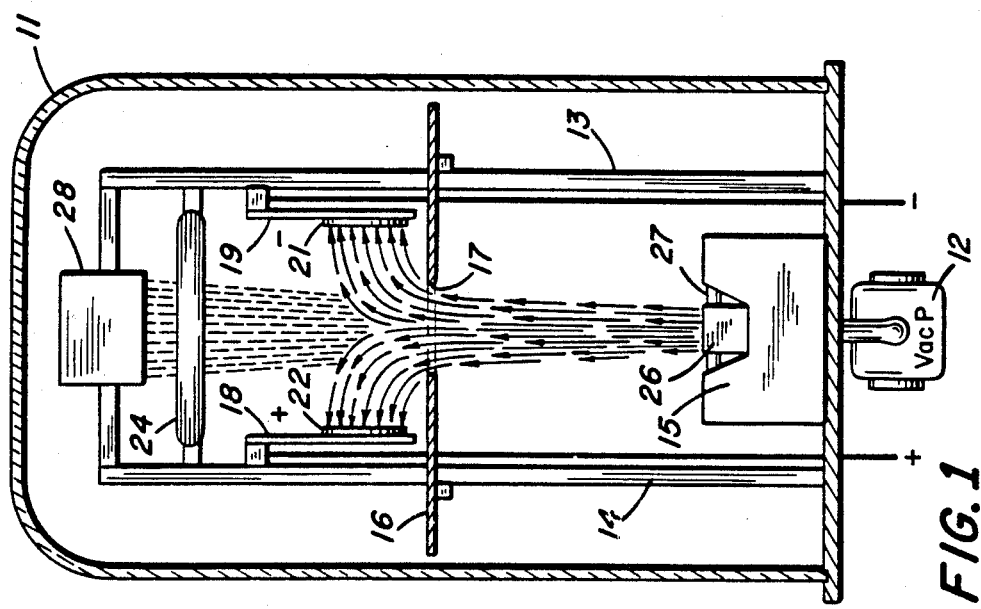
FIG. 1 is a front view of apparatus for growing diamond films.

Referring now to FIGS. 1 and 2, a detailed drawing of an apparatus for producing diamond film at low temperatures is shown. The process is carried out in a vacuum chamber 11 which is connected to a vacuum pump 12. A vacuum of approximately $10^{-6}$ Torr. is established inside the chamber 11.

A support frame 13 supports a collimator plate 16 over an E-gun source 15. The collimator plate 16 includes an aperture 17 which will permit a collimated beam of carbon ions to pass through the collimator plate. First and second deflection plates 18 and 19 are shown in FIG. 1 comprising a front view of the apparatus. The deflection plates 18 and 19 are connected to a source of voltage potential which is selected to be between 100 and 1,000 volts. The voltage potential is preferably a DC potential producing an electrostatic field strength of 100 v/cm, but a time varying ramp voltage or alternating voltage potential may be utilized in some instances. The deflection plates 18 and 19 are spaced an equal distance from the axis of the aperture 17. First and second substrates 21 and 22 are placed adjacent the deflection plates 18 and 19, and in the path of an electrostatic field established between plates 18 and 19. An electric heater 24 is positioned inside the vacuum chamber 11 to maintain the temperature at preferably 200° C. It has been found that a moderate temperature of 200° C. will not adversely effect most common substrates 21 and 22, yet will promote diamond growth.

A titanium sublimation pump in conjunction with a liquid nitrogen cooled cylindrical surface 28 may be used above the source 15 and deflection field plates 18 and 19, to trap carbon neutrals and obtain a better vacuum.

The E-gun 15 may be a conventional E-gun source such as the Temescal 10KV electron gun, known to those skilled in the vacuum deposition processes having a power 1–6KW. The E-gun 15 is shown as the lowermost component, including a carbon block 26, disposed in the path of an electron source 27 which may be the tungsten filament source associated with the E-gun 15. The carbon block 26 will vaporize along the surface due to the incident electrons. The vaporized particles will rise and collisions with the incident electron source beam results. The collisions and X-rays produced from E-gun operation are such as to produce ions of carbon, of both + and − polarity. Due to the vaporization of the carbon surface, the resulting carbon ions are in a vapor which rises towards the collimator plate 16. The collimator plate 16 includes an aperture to permit passage of the carbon ions. It may also be possible to produce carbon or hydrocarbon ions by interaction of alkanes such as methane and n-butane and the electrons from the E-gun 15.

The collimated carbon ions are relatively pure, including few contaminants, as compared with a conventional plasma used in other prior art diamond film growing systems. The carbon ions exiting the aperture 17 are swept by the electrostatic field between electrode plates 18 and 19 towards one or the other substrates 21 and 22, depending on the polarity of the exiting ions. The bending of the collimated beam at an angle shown to be substantially perpendicular to the axis of the aperture 17 helps separate the charged ions from any unwanted neutral species. Thus, the substrates are kept out of a line of sight path with the source 15. Additionally, the field strength of the electrostatic field will impart sufficient energy to the accelerated ions to promote diamond growth. Over the course of time, a film of diamond material will be deposited on each of the substrates 21 and 22. The foregoing system, depending on the size of the electron source 15, has the capability of depositing from a few hundred Angstroms up to 1 micron thick diamond film layers on substrates 21 and 22. Deposition rates of 30 Angstroms/minute have been obtained. It may also be possible to utilize a magnetic field to bend the ion stream at an angle to the collimated beam.

In tests using apparatus in accordance with the foregoing, diamond film thickness of several hundred to one thousand Angstroms have been deposited on NACL substrates. The resulting substrate and diamond film have been viewed under optical microscopes, as well as in spectrometers, to confirm the purity of the diamond film and its uniformity.

Films varying in structure and properties from amorphous diamond-like as in the prior art, to those of a polycrystalline nature, as confirmed by TEM diffraction pattern analysis, can be made by our method. In either case, amorphous or polycrystalline, the films are largely diamond. Diamond films are known to have the following desirable physical properties:
1. very high resistivity
2. insolubility in HF
3. extreme hardness
4. transparency in the visible range
5. good heat conductor
6. high dielectric constant
7. high index of refraction.

The foregoing technique is relatively inexpensive as far as vacuum deposition processes are concerned, and most of the components are standard.

Variations in film properties can be controlled by the degree of shielding used to insure that a minimum number of neutral carbon atoms arrive at the substrate, as well as controlling the electrostatic field strength which in turn determines how much energy the incident ions have during deposition. Carbon neutrals tend to grow as graphite and inhibit the diamond structure growth process. Carbon atoms have a low sticking coefficient and ricochet off vacuum system walls and fixtures and can arrive at places first thought to be in a shielded location of the system. However, with suitable shielding, these multiple trajectories of the carbon atoms can be blocked, insuring that the substrate will receive many more carbon ions than neutrals and a diamond film will result. The quality of this film depends on the percent carbon neutral impurity. The higher the impurity the more the film tends to become amorphous. Less impurity results in polycrystalline high quality films. Above a certain critical amount of impurity, the film is no longer predominantly diamond and begins to conduct or exhibit lower resistivity and loses its transparency. Films of this type may have uses as resistors in microelectronic applications. Other prior art techniques having the substrate in a line of sight path with the source are susceptible to this graphitization impurity problem and try to cope with it with various techniques such as simultaneous or subsequent irradiation with argon, hydrogen, oxygen or carbon dioxide to remove the graphite. These processes, in contrast to the present invention, generate heat and are injurious to any microelectronic circuit chip substrate. Substrate temperatures of from room temperature to 200° C. are adequate for producing diamond films with this invention.

With the foregoing process, the temperature is maintained at moderate levels, where 200° C. is preferable, but in which much lower temperatures will still promote diamond film growth on a respective substrate. The use of the E-gun and carbon block reduces the contaminant level normally found in conventional plasma generating systems, and the contaminant level is further held to a minimum through use of the apertured collimator.

Those skilled in the art will recognize yet other embodiments as described more particularly by the following claims.

Having thus described our invention, what we claim as new, and desire to secure by Letters Patent is:

1. A method of depositing diamond carbon material on a substrate, the method comprising the steps of:
   (a) positioning a solid carbon source composed of substantially pure carbon at a carbon-source position in a vacuum chamber, a surface portion of the solid carbon source defining a carbon-vapor-source area;
   (b) positioning a substrate at a substrate position in the vacuum chamber, a surface portion of the substrate defining a carbon-deposition area, a carbon-ion-transport path extending within the vacuum chamber from the carbon-vapor-source area of the solid carbon source to the carbon-deposition area of the substrate, the carbon deposition area of the substrate being shielded from any line-of-sight exposure to the carbon-vapor-source area;
   (c) evacuating an interior of the vacuum chamber to a vacuum;
   (d) imposing an electromagnetic ion/neutral separation field over an ion/neutral separation region in the vacuum chamber, the carbon-ion-transport path extending through the ion/neutral separation region, the carbon-ion transport path having an initial line-of-sight portion extending from the carbon-vapor-source area of the solid carbon source into the ion/neutral separation region; and (e) electrically vaporizing and ionizing carbon material from the carbon-vapor-source area of the solid carbon source to form a carbon vapor of neutral carbon species and ionized carbon species, carbon vapor travelling along the initial line-of-sight portion of the carbon-ion transport path into the ion/neutral separation region, the electromagnetic ion/neutral separation field having an intensity and direction effective to separate at least a fraction of ionized carbon species of a first polarity in the carbon vapor from the neutral carbon species in the carbon vapor and any ionized carbon species of a second opposite polarity in the carbon vapor and substantially selectively to direct such ionized carbon species of the first polarity to impact the carbon-deposition area of the substrate, essentially no neutral carbon species and ionized carbon species of the second polarity arriving at the carbon-deposition area of the substrate, the ionized carbon species of the first polarity impacting the carbon-deposition area of the substrate forming diamond carbon material on the substrate.

2. The method of claim 1 in which the substrate is initially essentially diamond free.

3. The method of claim 2 further including the step of maintaining the substrate at a temperature in the range of from room temperature to about 200° C.

4. The method of claim 2 in which the electromagnetic ion/neutral separation field is an electrostatic field.

5. The method of claim 4 in which the electrostatic ion/neutral separation field is imposed by impressing a potential difference between a first electrode and a second electrode, the two electrodes being located in the vacuum chamber and spaced apart from one another on opposing sides of the initial line-of-sight portion of the carbon-ion transport path, the potential difference being in the range of from about 100 volts to about 1000 volts.

6. The method of claim 5 in which the potential difference impressed between the two electrodes has a value effective to produce an electrostatic field strength of about 100 volts/cm.

7. The method of claim 2 in which the step of electrically vaporizing and ionizing carbon material from the carbon-vapor-source area of the solid carbon source includes directing an electron beam onto the carbon-vapor-source area.

8. A method of depositing diamond carbon material on a substrate, the method comprising the steps of:

(a) providing a carbon source at a carbon-source position in a vacuum chamber, a portion of eh carbon source defining a carbon-vapor-source region;

(b) positioning a substrate at a substrate position in the vacuum chamber, the substrate initially being essentially diamond free, a surface portion of the substrate defining a carbon-deposition area, a carbon ion-transport path extending within the vacuum chamber from the carbon-vapor-source region of the carbon source to the carbon-deposition area of the substrate, the carbon deposition area of the substrate being shielded from any line-of-sight exposure to the carbon-vapor-source region;

(c) evacuating the vacuum chamber to a vacuum;

(d) imposing an electromagnetic ion/neutral separation field over an ion/neutral separation region in the vacuum chamber, the carbon-ion-transport path extending through the ion-neutral separation region, the carbon-ion transport path having an initial line-of-sight portion extending from the carbon-vapor-source region of the carbon source into the ion/neutral separation region; and, (e) ionizing carbon material from the carbon-vapor-source region of the carbon source to form a carbon vapor comprising neutral carbon species and ionized carbon species, carbon vapor travelling along the initial line-of-sight portion of the carbon-ion-transport path into the ion/neutral separation region, the electromagnetic ion/neutral separation field having an intensity and direction effective to separate at least a fraction of the ionized carbon species of a first polarity in the carbon vapor from neutral carbon species in the carbon vapor and any ionized carbon species of a second opposite polarity in the carbon vapor and substantially selectively to direct such ionized carbon species of the first polarity to impact the carbon-deposition area of the substrate, essentially no neutral carbon species and ionized carbon species of the second polarity arriving at the carbon-deposition area of the substrate, the ionized carbon species of the first polarity impacting the carbon deposition area of the substrate forming diamond carbon material on the substrate.

9. The method of claim 8 in which the carbon source is solid and is composed of substantially carbon, the carbon-vapor-source region being a surface portion of the solid carbon source, and in which the step of ionizing carbon material from the carbon-vapor-source, and in which the step of ionizing carbon material from the carbon-vapor-source region comprises electrically vaporizing and ionizing carbon material from the carbon-vapor-source region of the solid carbon source.

10. The method of claim 9 in which the step of electrically vaporizing and ionizing carbon material from the carbon-vapor-source area of the solid carbon source includes directing an electron beam onto the carbon-vapor-source region.

11. The method of claim 8 further including the step of maintaining the substrate at a temperature in the range of from room temperature to about 200° C.

12. The method of claim 8 in which the electromagnetic ion/neutral separation field is an electrostatic field.

13. The method of claim 12 in which the electrostatic ion/neutral separation field is imposed by impressing a potential difference between a first electrode and a second electrode, the two electrodes being located in the vacuum chamber and spaced apart from one another on opposite sides of the initial line-of-sight portion of the carbon-ion-transport path, the potential difference being in the range of from about 100 volts to about 1000 volts.

14. The method of claim 13 in which the potential difference impressed between the two electrodes has a value effective to produce an electrostatic field strength of about 100 volts/cm.

15. A diamond-carbon-material-deposition apparatus for depositing diamond carbon material on a substrate, the apparatus comprising:

(a) a vacuum-tight vacuum chamber;

(b) a carbon-source positioner for positioning a solid carbon source composed of substantially pure carbon at a carbon-source position in the vacuum chamber so that in operation a surface portion of the solid carbon source defines a carbon-vapor-source area;

(c) a substrate positioner for positioning a substrate at a substrate position in the vacuum chamber so that in operation a surface portion of the substrate defines a carbon-deposition area;

(d) a neutral-carbon-species shield located in the vacuum chamber, the neutral-carbon-species shield being shaped and positioned relative to the carbon-vapor-source area and the carbon-deposition area to shield the carbon-deposition deposition area of the substrate from any line-of-sight exposure to the carbon-vapor-source area, a carbon-ion-transport path being defined to extend within the vacuum chamber from the carbon-vapor-source area of the solid carbon source through the neutral-carbon species shield to the carbon-deposition area of the substrate;

(e) a first electrode and a second electrode, the two electrodes being located in the vacuum chamber and spaced apart from one another, a region between the first and the second electrodes defining an ion/neutral separation region in the vacuum chamber, the carbon-ion-transport path extending through the ion/neutral separation region, the carbon-ion-transport path having an initial line-of-sight portion extending from the carbon-vapor-source area of the solid carbon source into the ion/neutral separation region; and (f) a carbon vaporizer and ionizer for electrically vaporizing and ionizing carbon material from the carbon-vapor-source area of the solid carbon source to form a carbon vapor of neutral carbon species and ionized carbon species so that in operation carbon vapor travels along the initial line-of-sight portion of the carbon-ion-transport path into the ion/neutral separation region to be exposed to an electromagnetic ion/neutral separation field imposed between the first and the second electrodes, the ion/neutral separation field having an intensity and direction effective to separate at least a fraction of ionized carbon species of a first polarity in the carbon vapor from the neutral carbon species in the carbon vapor and any ionized carbon species of a second opposite polarity in the carbon vapor and substantially selectively to direct such ionized carbon species of the first polarity to impact the carbon-deposition area of the substrate, essentially no neutral carbon species and ionized carbon species of the second polarity arriving at the carbon-deposition area of the substrate, the ionized carbon species of the first polarity impacting the carbon-deposition area of the substrate forming diamond carbon material on the substrate.

16. The apparatus of claim 15 in which the carbon vaporizer and ionizer includes an E-gun for directing an electron beam onto the carbon-vapor-source area of the solid carbon source.

17. The apparatus according to claim 16 in which the substrate positioner is adapted to position the substrate adjacent to one of the two electrodes.

18. The apparatus according to claim 17 in which the neutral-carbon-species shield is a collimator plate having a collimator aperture passing through it, the collimator plate being positioned between the carbon-vapor-source area and the two electrodes, the two electrodes being spaced an approximately equal distance from an axis o the collimator aperture which extends generally parallel to the initial line-of-sight portion of the carbon-ion-transport path.

* * * * *